(12) United States Patent
Salmon

(10) Patent No.: US 12,136,576 B1
(45) Date of Patent: Nov. 5, 2024

(54) MICROELECTRONIC MODULE

(71) Applicant: Peter C. Salmon, Mountain View, CA (US)

(72) Inventor: Peter C. Salmon, Mountain View, CA (US)

(*) Notice: Subject to any disclaimer, the term of this patent is extended or adjusted under 35 U.S.C. 154(b) by 0 days.

(21) Appl. No.: 18/607,807

(22) Filed: Mar. 18, 2024

Related U.S. Application Data

(60) Provisional application No. 63/522,540, filed on Jun. 22, 2023.

(51) Int. Cl.
*H05K 7/20* (2006.01)
*H01L 21/56* (2006.01)
*H01L 23/31* (2006.01)
*H01L 23/44* (2006.01)
*H01L 23/29* (2006.01)

(52) U.S. Cl.
CPC .......... *H01L 23/3121* (2013.01); *H01L 21/56* (2013.01); *H01L 23/44* (2013.01); *H05K 7/20772* (2013.01); *H01L 23/29* (2013.01); *H01L 23/291* (2013.01); *H01L 23/293* (2013.01)

(58) Field of Classification Search
CPC combination set(s) only.
See application file for complete search history.

(56) References Cited

U.S. PATENT DOCUMENTS

| | | | |
|---|---|---|---|
| 4,114,275 A | 9/1978 | Jones et al. | |
| 4,124,338 A | 11/1978 | Mitchell | |
| 4,169,262 A | 9/1979 | Schwartz et al. | |
| 4,259,676 A | 3/1981 | Salmon | |
| 4,309,365 A | 1/1982 | Van Ness et al. | |
| 4,341,518 A | 7/1982 | Wallace | |
| 4,366,802 A | 1/1983 | Goodine et al. | |
| 4,419,300 A | 12/1983 | Ness et al. | |
| 4,534,803 A | 8/1985 | Asano et al. | |
| 4,551,787 A | 11/1985 | Mittal et al. | |
| 4,585,293 A | 4/1986 | Czeschka et al. | |
| 4,669,529 A | 6/1987 | Evertz | |
| 4,677,528 A | 6/1987 | Miniet | |
| 4,733,256 A | 3/1988 | Salmon | |
| 4,765,400 A | 8/1988 | Chu et al. | |
| 4,777,500 A | 10/1988 | Salmon | |
| RE32,897 E | 3/1989 | Salmon | |
| 4,928,207 A | 5/1990 | Chrysler et al. | |

(Continued)

OTHER PUBLICATIONS

Birbarah et al., Water Immersion Cooling of High Power Density Electronics, International Journal of Heat and Mass Transfer, 2020, vol. 147, 13 pages.

(Continued)

*Primary Examiner* — Lisa Lea-Edmonds
(74) *Attorney, Agent, or Firm* — Jennifer Hayes; Nixon Peabody LLP

(57) ABSTRACT

A microelectronic module includes a substrate having a plurality of mounted electronic components. The components are selected from bare die, chiplets, stacked devices, low-profile packaged devices, optical and electro-optical devices, and surface mount devices. A water-impermeable coating surrounds the microelectronic module except for an opening at the top for making input/output connections. A water-cooled server includes a plurality of the microelectronic modules disposed in a tank with cooling water flowing around the modules.

20 Claims, 7 Drawing Sheets

(56) References Cited

U.S. PATENT DOCUMENTS

| | | |
|---|---|---|
| 4,973,247 A | 11/1990 | Varnes et al. |
| 4,975,058 A | 12/1990 | Woodward |
| 4,978,548 A | 12/1990 | Cope et al. |
| 4,993,229 A | 2/1991 | Baus et al. |
| 5,028,988 A | 7/1991 | Porter et al. |
| 5,030,976 A | 7/1991 | Salmon |
| 5,074,787 A | 12/1991 | Tsukada |
| 5,088,924 A | 2/1992 | Woodward |
| 5,145,370 A | 9/1992 | Woodward |
| 5,153,617 A | 10/1992 | Salmon |
| 5,155,661 A | 10/1992 | Nagesh et al. |
| 5,214,570 A | 5/1993 | Shah et al. |
| 5,283,446 A | 2/1994 | Tanisawa |
| 5,287,127 A | 2/1994 | Salmon |
| 5,323,292 A | 6/1994 | Brzezinski |
| 5,400,062 A | 3/1995 | Salmon |
| 5,465,192 A | 11/1995 | Yoshikawa |
| 5,476,572 A | 12/1995 | Prough |
| 5,478,778 A | 12/1995 | Tanisawa |
| 5,501,077 A | 3/1996 | Davis et al. |
| 5,514,906 A | 5/1996 | Love et al. |
| 5,555,579 A | 9/1996 | Wu et al. |
| 5,700,355 A | 12/1997 | Prough |
| 5,717,608 A | 2/1998 | Jensen |
| 5,778,677 A | 7/1998 | Hung et al. |
| 5,800,170 A | 9/1998 | Tsukada |
| 5,859,763 A | 1/1999 | Nam et al. |
| 5,897,610 A | 4/1999 | Jensen |
| 5,968,314 A | 10/1999 | Prough |
| 6,055,157 A | 4/2000 | Bartilson |
| 6,126,099 A | 10/2000 | Fachinger et al. |
| 6,126,883 A | 10/2000 | Troetscher et al. |
| 6,309,049 B1 | 1/2001 | Salmon |
| 6,210,262 B1 | 4/2001 | Burch et al. |
| 6,251,466 B1 | 6/2001 | Mcguire et al. |
| 6,404,640 B1 | 6/2002 | Ishimine et al. |
| 6,452,789 B1 | 9/2002 | Pallotti et al. |
| 6,467,679 B2 | 10/2002 | Kyomasu et al. |
| 6,491,202 B1 | 12/2002 | Kyomasu et al. |
| 6,528,878 B1 | 3/2003 | Daikoku et al. |
| 6,601,295 B2 | 8/2003 | Maekawa |
| 6,621,707 B2 | 9/2003 | Ishimine et al. |
| 6,644,058 B2 | 11/2003 | Bash et al. |
| 6,664,627 B2 | 12/2003 | Cheon |
| 6,817,204 B2 | 11/2004 | Bash et al. |
| 6,853,554 B2 | 2/2005 | Bash et al. |
| 6,881,609 B2 | 4/2005 | Salmon |
| 6,882,533 B2 | 4/2005 | Bash et al. |
| 6,890,799 B2 | 5/2005 | Daikoku et al. |
| 6,927,471 B2 | 8/2005 | Salmon |
| 7,069,737 B2 | 7/2006 | Wang et al. |
| 7,144,792 B2 | 12/2006 | Wilmot et al. |
| 7,163,830 B2 | 1/2007 | Salmon |
| 7,240,500 B2 | 7/2007 | Bash et al. |
| 7,254,024 B2 | 8/2007 | Salmon |
| 7,297,572 B2 | 11/2007 | Salmon |
| 7,408,258 B2 | 8/2008 | Salmon |
| 7,415,289 B2 | 8/2008 | Salmon |
| 7,427,809 B2 | 9/2008 | Salmon |
| 7,455,094 B2 | 11/2008 | Lee et al. |
| 7,505,862 B2 | 3/2009 | Salmon |
| 7,535,107 B2 | 5/2009 | Salmon |
| 7,586,747 B2 | 9/2009 | Salmon |
| 7,658,614 B2 | 2/2010 | Wilmot et al. |
| 7,659,141 B2 | 2/2010 | Chung-Long-Shan et al. |
| 7,738,250 B2 | 6/2010 | Wu et al. |
| 7,902,666 B1 | 3/2011 | Hsu et al. |
| 7,946,465 B2 | 5/2011 | Silverbrook et al. |
| 7,952,191 B2 | 5/2011 | Sunohara et al. |
| 7,988,033 B2 | 8/2011 | Chung-Long-Shan et al. |
| 8,252,635 B2 | 8/2012 | Salmon |
| 8,369,091 B2 | 2/2013 | Campbell |
| 8,457,806 B2 | 6/2013 | Shah |
| 8,685,833 B2 | 4/2014 | Khanna et al. |
| 8,780,552 B2 | 7/2014 | El-Essawy |
| 8,787,015 B2 | 7/2014 | El-Essawy |
| 8,842,688 B2 | 9/2014 | Vahdat |
| 8,922,511 B1 | 12/2014 | Salmon |
| 9,059,070 B2 | 6/2015 | Salmon |
| 9,061,893 B1 | 6/2015 | Minervini |
| 9,095,942 B2 | 8/2015 | Campbell |
| 9,142,533 B2 | 9/2015 | Shen et al. |
| 9,214,416 B1 | 12/2015 | Furnival |
| 9,227,220 B1 | 1/2016 | Salmon |
| 9,250,024 B2 * | 2/2016 | Campbell ............... F28F 3/048 |
| 9,257,751 B2 | 2/2016 | Felic et al. |
| 9,386,685 B2 | 7/2016 | Bonkohara |
| 9,493,102 B2 | 11/2016 | Tang et al. |
| 9,576,409 B2 | 2/2017 | Salmon |
| 9,633,771 B2 | 4/2017 | Salmon |
| 9,761,620 B1 | 9/2017 | Salmon |
| 9,773,755 B2 | 9/2017 | Shen et al. |
| 9,874,923 B1 | 1/2018 | Brown |
| 10,039,210 B2 | 7/2018 | Wong |
| 10,249,503 B2 | 4/2019 | Yoon et al. |
| 10,336,599 B2 | 7/2019 | Miles |
| 10,461,009 B2 | 10/2019 | Hung et al. |
| 10,481,650 B2 | 11/2019 | Saito |
| 10,613,603 B2 | 4/2020 | Bose |
| 10,624,236 B2 | 4/2020 | Inano |
| 10,701,832 B2 | 6/2020 | Chainer et al. |
| 10,757,833 B2 | 8/2020 | Bodenweber |
| 10,888,031 B2 * | 1/2021 | Franz ............... G11C 29/56016 |
| 10,893,631 B2 * | 1/2021 | Tsai ................... H05K 7/20254 |
| 10,910,364 B2 | 2/2021 | Or-Bach |
| 10,966,338 B1 | 3/2021 | Salmon |
| 11,064,626 B1 | 7/2021 | Salmon |
| 11,138,103 B1 | 10/2021 | Shi |
| 11,256,320 B2 | 2/2022 | Mcnamara |
| 11,379,254 B1 | 7/2022 | Karumbunathan |
| 11,393,807 B2 | 7/2022 | Salmon |
| 11,417,582 B2 * | 8/2022 | Chen ....................... H01L 21/56 |
| 11,445,640 B1 * | 9/2022 | Salmon .............. H05K 7/20781 |
| 11,523,543 B1 * | 12/2022 | Salmon ..................... G06F 1/20 |
| 11,546,991 B2 | 1/2023 | Salmon |
| 11,646,242 B2 * | 5/2023 | Costa .................. H01L 23/3121 |
| | | 257/796 |
| 11,670,618 B2 * | 6/2023 | Yang .................. H01L 25/0652 |
| | | 257/659 |
| 11,692,271 B2 * | 7/2023 | Miljkovic ......... H01L 21/02126 |
| | | 427/248.1 |
| 11,856,727 B2 | 12/2023 | Monteserin |
| 11,997,830 B2 * | 5/2024 | Heydari .................... G06F 1/20 |
| 2001/0042777 A1 | 11/2001 | Kyomasu et al. |
| 2003/0000552 A1 | 9/2003 | Bratten et al. |
| 2003/0151130 A1 | 12/2003 | Cheon |
| 2005/0240812 A1 | 10/2005 | Anderson |
| 2006/0244926 A1 | 4/2006 | Shih et al. |
| 2007/0007983 A1 | 1/2007 | Salmon |
| 2007/0074853 A1 | 4/2007 | Popovich |
| 2007/0176298 A1 | 8/2007 | Osone |
| 2007/0240785 A1 | 10/2007 | Lee |
| 2007/0256773 A1 | 11/2007 | Huang |
| 2009/0185343 A1 | 7/2009 | Wu |
| 2010/0275971 A1 | 11/2010 | Zingher |
| 2011/0192172 A1 | 8/2011 | Delacruz |
| 2011/0302346 A1 | 12/2011 | Vahdat |
| 2012/0165908 A1 | 6/2012 | Kou et al. |
| 2012/0217772 A1 | 8/2012 | Tang |
| 2013/0015578 A1 | 1/2013 | Thacker |
| 2013/0228898 A1 | 9/2013 | Ide |
| 2014/0123492 A1 | 5/2014 | Campbell |
| 2014/0137581 A1 | 5/2014 | Cho |
| 2015/0199858 A1 | 7/2015 | Salmon |
| 2015/0287708 A1 * | 10/2015 | Lin ...................... H01L 23/5389 |
| | | 438/109 |
| 2016/0013148 A1 * | 1/2016 | Lin ......................... H01L 24/19 |
| | | 257/773 |
| 2016/0081227 A1 | 3/2016 | Lee |
| 2016/0088756 A1 | 3/2016 | Ramadas |
| 2016/0155682 A1 | 6/2016 | Ahuja et al. |
| 2017/0015477 A1 | 1/2017 | Miles |
| 2017/0254574 A1 | 1/2017 | Miles |
| 2017/0292782 A1 | 10/2017 | Joyer et al. |

(56) References Cited

U.S. PATENT DOCUMENTS

| | | |
|---|---|---|
| 2017/0308133 A1 | 10/2017 | Soffer |
| 2017/0354061 A1 | 12/2017 | Saito |
| 2018/0170744 A1 | 6/2018 | Petersen et al. |
| 2018/0293017 A1 | 10/2018 | Curley |
| 2018/0315730 A1 | 11/2018 | Gill et al. |
| 2018/0320937 A1 | 11/2018 | Deng et al. |
| 2019/0041104 A1 | 2/2019 | Yin |
| 2019/0041105 A1 | 2/2019 | Yin |
| 2019/0286373 A1 | 9/2019 | Karumbunathan et al. |
| 2019/0363196 A1 | 11/2019 | Wood |
| 2019/0377391 A1 | 12/2019 | Chen |
| 2020/0027809 A1 | 1/2020 | Hung et al. |
| 2020/0029465 A1 | 1/2020 | Chainer |
| 2020/0089293 A1 | 3/2020 | Enright |
| 2020/0091111 A1 | 3/2020 | Lee et al. |
| 2020/0093038 A1 | 3/2020 | Enright |
| 2020/0243429 A1 | 7/2020 | Lai et al. |
| 2020/0310394 A1 | 10/2020 | Wouhaybi |
| 2020/0328139 A1 | 10/2020 | Chiu |
| 2021/0102294 A1* | 4/2021 | Miljkovic ............ C23C 14/5853 |
| 2021/0343690 A1 | 11/2021 | Salmon |
| 2022/0087048 A1 | 3/2022 | Enright |
| 2022/0113784 A1 | 4/2022 | Alben et al. |
| 2022/0217845 A1 | 7/2022 | Salmon |
| 2022/0328427 A1* | 10/2022 | Coppola ................ H01L 23/473 |
| 2023/0088049 A1 | 3/2023 | Salmon |
| 2023/0180439 A9 | 6/2023 | Enright |
| 2023/0276600 A1* | 8/2023 | Salmon ................ H05K 7/1487 |
| | | 361/679.53 |
| 2023/0332293 A1* | 10/2023 | Miljkovic ............... C23C 16/56 |
| 2023/0380101 A1 | 11/2023 | Sullivan |
| 2023/0413466 A1 | 12/2023 | Heydari |
| 2024/0164064 A1* | 5/2024 | Salmon ..................... G06F 1/20 |

OTHER PUBLICATIONS

Gebrael et al., High-Efficiency Cooling via the Monolithic Integration of Copper on Electronic Devices, Nature Electronics, 2022, vol. 5, pp. 394-402.

* cited by examiner

MICROELECTRONIC MODULE

RELATED APPLICATIONS

This application claims the benefit of and priority under 35 U.S.C. § 119(e) to U.S. provisional patent application No. 63/522,540 filed Jun. 22, 2003, the entirety of which is hereby incorporated by reference.

This application is related to U.S. Pat. No. 10,966,338, filed Mar. 11, 2020, U.S. Pat. No. 11,064,626, filed Oct. 14, 2020, U.S. Pat. No. 11,393,807, filed Jul. 8, 2021, U.S. Pat. No. 11,546,991, filed Mar. 2, 2022, and U.S. patent application Ser. No. 17/989,549, filed Nov. 17, 2022, each entitled "DENSELY PACKED ELECTRONIC SYSTEMS," and each hereby incorporated by reference in their entireties.

This application is also related to U.S. Pat. No. 11,445,640, filed Feb. 25, 2022, U.S. Pat. No. 11,523,53, filed May 6, 2022, and U.S. patent application Ser. No. 17/982,393, filed Nov. 7, 2022, each entitled "WATER COOLED SERVER," and each hereby incorporated by reference in their entireties.

TECHNICAL FIELD

This invention relates to the field of microelectronic modules and their integration into water-cooled electronic systems.

BACKGROUND

Microelectronic modules employ processors and supporting devices mounted on printed circuit boards. High-power chips mounted on the printed circuit boards are typically sold as packaged devices that require large heat sinks. The packaged devices and the heat sinks occupy considerably more space than the original die contained within the packages.

FIG. 45 of U.S. Patent Pub. No. US 2021/0343690 illustrates a computer system comprising multiple laminate blocks partially immersed in a cooling liquid inside of a tank. Extruded copper elements having cooling fins are shown.

FIG. 11 of U.S. Pat. No. 11,523,543 describes the details of a microelectronic module that is immersible in water.

FIG. 12 of U.S. Pat. No. 11,523,543 depicts a thermal configuration for cooling a high-performance computing (HPC) chip having a rated power of 700 W. Element 126 is described as a metallization, "wherein the metallization is coupled to polished planar surfaces at the first and second sides of the substrate, created by back-grinding and polishing the plurality of electronic components flip-chip mounted on the first and second sides of the substrate".

SUMMARY

Embodiments of the invention are directed to microelectronic modules and computer server configurations having increased power density and improved manufacturability.

In accordance with a first aspect of the invention, a microelectronic module includes a substrate with thin film conductors formed on the substrate, wherein selected conductors have a half-pitch in the range of 50 nm-2 μm. Electronic components are mounted on the substrate at connection points provided by the thin film conductors. Flip chip assembly may be used for mounting the electronic components. A water-impermeable coating covers the substrate and the electronic components, preventing water intrusion that could damage the electronic components. When immersed in flowing water the microelectronic module is operable at an average power level in the range of 10 W-2,000 W per square centimeter of substrate area.

The substrate and mounted components comprise a microelectronic assembly. The height of the components mounted on the substrate may vary between around 50 micrometers and around 1.5 millimeters for example. The water-impermeable coating may comprise a single layer or a sequence of layers. The first of the water-impermeable layers is preferably a conformable coating, to bond to and completely cover any microscopic fissures or features in the substrate or in the mounted components. This first layer may be a conformable layer of dielectric material such as Parylene C or silicon nitride applied by chemical vapor deposition (CVD). Layers of Parylene C may be deposited both before and after metal oxide layers. The metal oxide layers may be deposited by atomic layer deposition (ALD). If the top layer of the microelectronic assembly is already a dielectric layer, for example if back side power distribution is employed, the first layer may comprise a metal such as titanium. Plasma activation may be employed to promote covalent bonds between one or more layers of the water-impermeable coating, and between the bottom layer and the underlying microelectronic assembly. In an embodiment the water-impermeable coating comprises at least one thin film metal selected from titanium, nickel, copper, and gold. In another embodiment the water-impermeable layer may comprise polyurethane or an acrylic material. A keep-out portion of the substrate, not coated with the water-impermeable layer, may be provided for exposing conductive traces that connect with a motherboard.

Spaces between the components may optionally be filled with a filler material. The electronic components and the filler material may optionally be back-ground and polished to form a polished planar surface.

The electronic components may be selected from bare die, chiplets, stacked devices, low-profile packaged devices, optical and electro-optical devices, and surface mount devices. Stacked devices may include a chiplet, an interposer or a bridge device. Optical and electro-optical devices may include optical fibers for routing high-speed signals. To control warpage, components on a first side of the substrate may be mounted in a mirror image of components mounted on a second side of the substrate.

The electronic components mounted on the substrate may be organized in tiles arrayed on one or both sides of the substrate. Each tile may be operable as an independently operable cluster of components. Each tile may include at least one processor, at least one memory device, at least one communication device and at least one sensor. Each tile may include redundant components for replacing failed or failing components. Each tile or group of tiles may further include a test/monitor chip for determining failed or failing components. Each tile or group of tiles may also include a power distribution device which may be used to power up or power down selected components. Each tile may be networked with one or more neighboring tiles. Each tile may be operable at an average power level in the range of 10 W-2,000 W per square centimeter of substrate area.

In accordance with a second aspect of the invention, a water-cooled server may include multiple microelectronic modules that are operable when partially immersed in a tank of water. Each module may be configured similarly and operate similarly to microelectronic modules as described above in accordance with the first aspect of the invention. The water-cooled server may include separators between the microelectronic modules, and each separator may comprise a wire structure such as a wire frame. The water-cooled server may include a gasket and a backing plate at the top end of each microelectronic module for sealing against water intrusion. Each microelectronic module may attach to a motherboard using a socket or connector.

In accordance with a third aspect of the invention, a method for manufacturing a microelectronic module includes providing a substrate with conductors fabricated thereon having line and space dimensions in the range of 50 nm-2 µm; mounting electronic components on the substrate with conductors fabricated thereon to form a microelectronic assembly; and, coating the microelectronic assembly with a water-impermeable coating while maintaining a keep-out area for making input/output connections to the microelectronic assembly, thereby creating a microelectronic module that can survive immersion and operation in water.

In accordance with a fourth aspect of the invention, a method for building a water-cooled electronic system includes providing a substrate with conductors fabricated thereon having line and space dimensions in the range of 50 nm-2 µm; mounting electronic components on the substrate with conductors fabricated thereon to form a microelectronic assembly; coating the microelectronic assembly with a water-impermeable coating while maintaining a keep-out area for making input/output connections to the microelectronic assembly, thereby creating a microelectronic module; making input/output connections between the microelectronic module and a motherboard; and, partially immersing the microelectronic module in water to form a water-cooled electronic system.

BRIEF DESCRIPTION OF THE DRAWINGS

The accompanying drawings, which are incorporated into and constitute a part of this specification, illustrate examples of embodiments. The examples of embodiments, together with the description of example embodiments, explain the principles and implementations of the embodiments.

DETAILED DESCRIPTION

Figure 1:
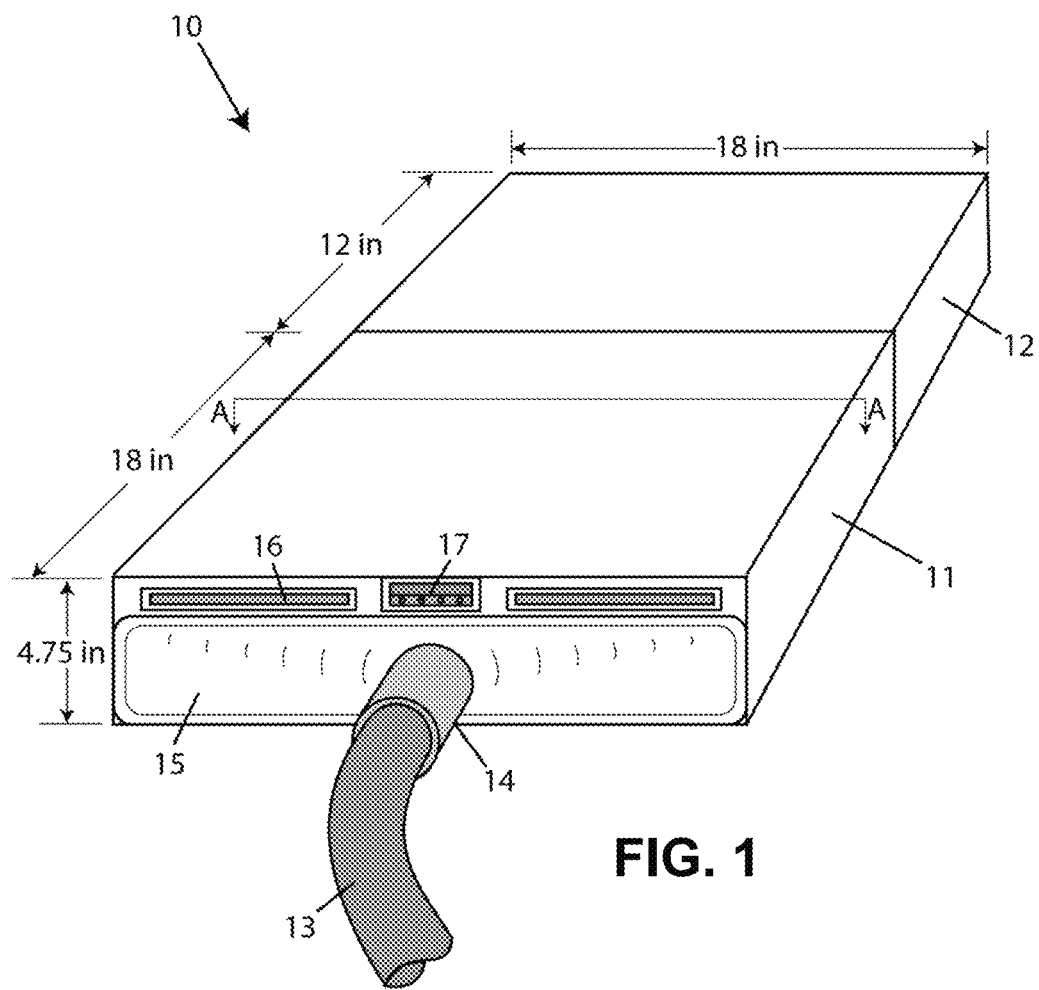
FIG. 1 is a perspective external view of a water-cooled server in accordance with an embodiment of the present disclosure.

FIG. 1 illustrates a server embodiment 10 of the present disclosure. As shown, it is 18 inches wide, 4.75 inches high, and 30 inches deep. It will be appreciated that these dimensions are exemplary and that the actual dimensions may vary from those shown in FIG. 1. This size fits in a 3U rack, but any size may be used. Server 10 includes a densely packed front assembly 11 and a bus bar assembly 12. Bus bar assembly 12 is required to deliver adequate power to server 10, for example 3,125 A at 640V in an embodiment of the present disclosure. Cooling water enters by input hose 13 which employs a coupler 14 to connect with front cover plate 15 which distributes the incoming water across the face of server 10. A similar hose connection is provided at the rear of server 10 for carrying the heated water to a dump site or to water-cooling equipment for recycling. The heated water may be used for the heating of buildings or for other purposes.

Electrical connectors 16 and optical connectors 17 are provided for connecting between servers and connecting with external signals and power. Many connector and signaling arrangements are possible within the scope of this embodiment. In an embodiment, hose 13 has an internal diameter of 2 inches and delivers cooling water at a rate of 200 gallons per minute (gpm), although flow rates in the range of 20-800 gpm may be used. At least one pump is required to pressurize the coolant water for delivery via pipes and conduits to each server 10.

Figure 2:
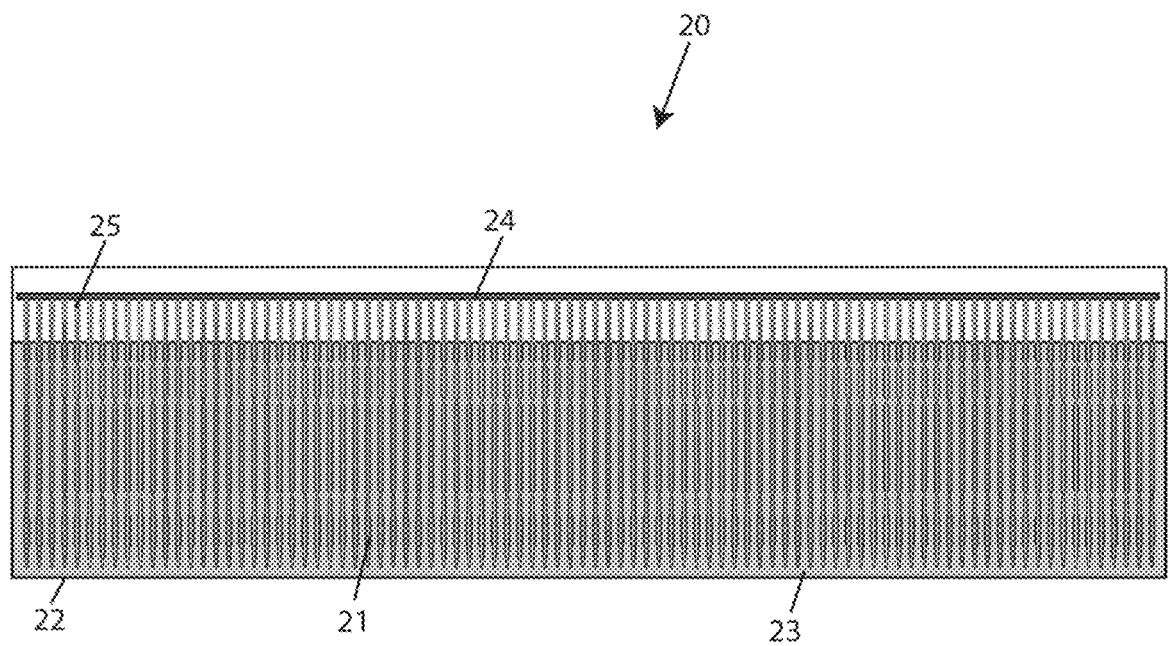
FIG. 2 illustrates a cross-sectional view corresponding to section AA of FIG. 1 in accordance with an embodiment of the present disclosure.
Figure 6:
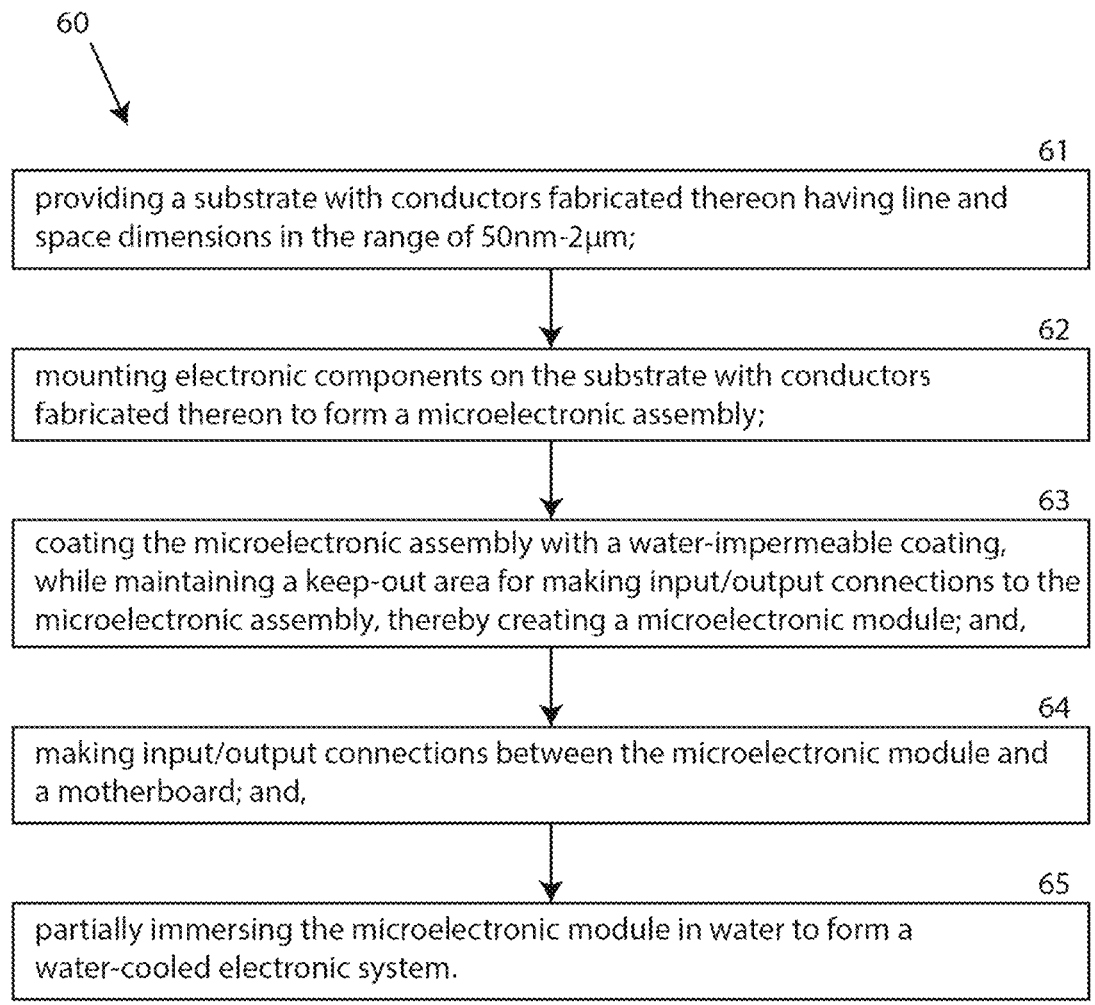
FIG. 6 is a flow chart of a method for building a water-cooled electronic system, in accordance with an embodiment of the present disclosure.

FIG. 2 is a cross-sectional view 20 of server 10 indicated by section AA of FIG. 1. Ninety microelectronic modules 21 are arrayed inside tank 22 which is partially filled with cooling water 23 that is flowing from front to back of server 10. In an embodiment the microelectronic modules 21 are spaced apart using wire frames (not shown) that do not significantly impede water flow. The wire frames may be used to support a desired spacing between microelectronic modules 21 and mitigate against bowing of substrates 31 when subjected to thermal/mechanical forces. Each computer module connects via a socket or connector 24 to a motherboard 25. FIG. 6 exemplifies repeated regularized structures in server 10, such as 90 copies of microelectronic module 21. This compares with multiple different structures required in prior art servers, including as examples packaged devices, heat sinks, daughter boards, large discrete components such as electrolytic capacitors, and special metal enclosures required for electromagnetic screening. Regularized structures lead to reduced design costs and reduced manufacturing costs.

Figure 3:
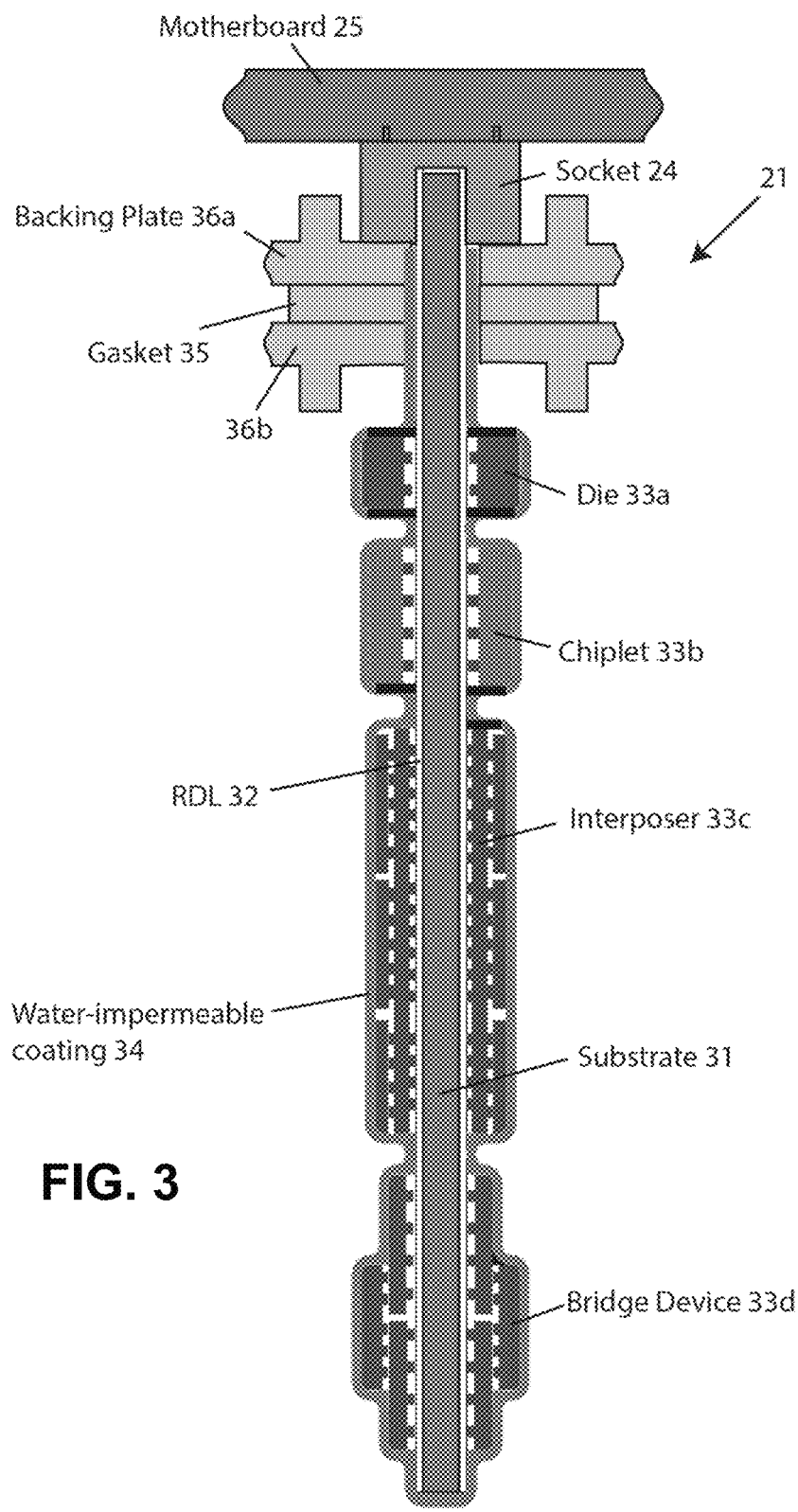
FIG. 3 is an expanded cross-sectional view of a microelectronic module, one of 90 depicted in FIG. 2, in accordance with an embodiment of the present disclosure.

FIG. 3 illustrates microelectronic module 21 in accordance with an embodiment of the present disclosure. Module 21 is shown connected to a motherboard 25. Substrate 31 may be an organic substrate or a higher temperature substrate such as quartz or silicon nitride. A glass substrate may be used. Higher temperature substrates may facilitate high-temperature plasma processing relating to the water-impermeable coating 34. Redistribution layers (RDL) 32 include thin film conductors having a half-pitch in the range of 50 nm-2 µm. A half-pitch of 2 µm enables flip chip bonding of components mounted with a bond pitch of 40 micrometers for example, as may be found in high bandwidth memories (HBMs), processors, and other devices. A half-pitch of 50 nm enables flip chip bonding of components mounted with a bond pitch of around 1 µm, as may be found in emerging devices that employ copper-to-copper hybrid bonds or other metal-to-metal bonds. Accordingly, the smallest half-pitch will be found in the top metal layer, where flip chip connections are made to bonding pads of mounted components. A variety of electronic components are shown flip chip bonded to RDL traces or to stacked components in stacked devices: a bare die 33a, a chiplet 33b, an interposer 33c, and a bridge device 33d are shown in the Figure. Mounted devices may include packaged components such as a variant of the H100 chip from NVIDIA or the AMDMI300X from ADVANCED MICRO DEVICES INC.; these devices may incorporate complex arrangements of graphics processing units (GPUs), central processing units (CPUs), and high-bandwidth memories (HBMs) for example. Not shown are optical and electro-optical devices which may also be included in microelectronic module 21. Optical and electro-optical devices may include optical fibers for routing high-speed signals. Passive components may also be used, and may be embedded in substrate 31.

The electronic components in FIG. 3 are shown with varying heights; a typical maximum height is 1 mm. Component heights may range from around 0.05 mm for chips having back side power distribution to around 1.2 mm for flash memory devices having over 200 layers. Water-impermeable layer 34 is shown as a conformable coating that covers the substrate and the electronic components mounted on the substrate. Optionally, a filler material (not shown) may be disposed between the mounted electronic components. The electronic components and the filler material may optionally be back-ground and polished to form a polished planar surface extending across a face of microelectronic module 21. After the polished planar surface is formed, thin film layers may be deposited for back side power delivery, or as RDLs providing interconnections between components. Water-impermeable coating 34 will be the outermost coating.

In embodiments of the present disclosure water-impermeable coating 34 comprises a conformable layer that effectively seals microscopic fissures and features (including defects) against water intrusion. As examples, the conformable layer may comprise Parylene C or silicon nitride formed using chemical vapor deposition (CVD). Water-impermeable coating 34 may comprise a polyurethane or acrylic material. To improve hermeticity, the conformable layer may further include metal oxides such as Al2O3 and TiO2 applied by atomic layer deposition (ALD); in one embodiment the conformable layer includes a 4-diyad (8-layer) stack of Al2O3 and TiO2 having a total thickness of around 100 nm. Various application methods may be employed such as a CVD deposition in a plasma, spraying, or painting, or roll-coating. Since problems such as corrosion and oxidation typically arise from poor adhesion between layers, a plasma activation process may be employed to promote the formation of covalent bonds between constituent layers, and between the bottom-most layer and the mounted electronic component, and between the bottom-most layer and the substrate 31. In another embodiment, water-impermeable coating 34 comprises at least one metal layer wherein the metal may be selected from a combination of titanium, nickel, copper, and gold; one combination is Ti/Ni/Au as employed in some back end of line (BEOL) wafer processes. Copper or nickel may be electroplated to form a more substantial water barrier. Nickel may be used as the final layer because it has good corrosion resistance. In an embodiment, thin dielectric layers that are water resistant but mechanically fragile are protected by thicker electroplated layers of copper and nickel that are mechanically robust, and durable in water environments that may include turbulence and cavitation as examples. However, due to their high thermal conductivity the thicker electroplated layers do not seriously degrade the thermal performance of water-impermeable coating 34.

A gasket 35 and backing plates 36a and 36b may be employed to seal against water intrusion at the top end of microelectronic module 21. A socket 24 may be provided to connect input/output signals and power between microelectronic module 21 and a motherboard 25.

Figure 4:
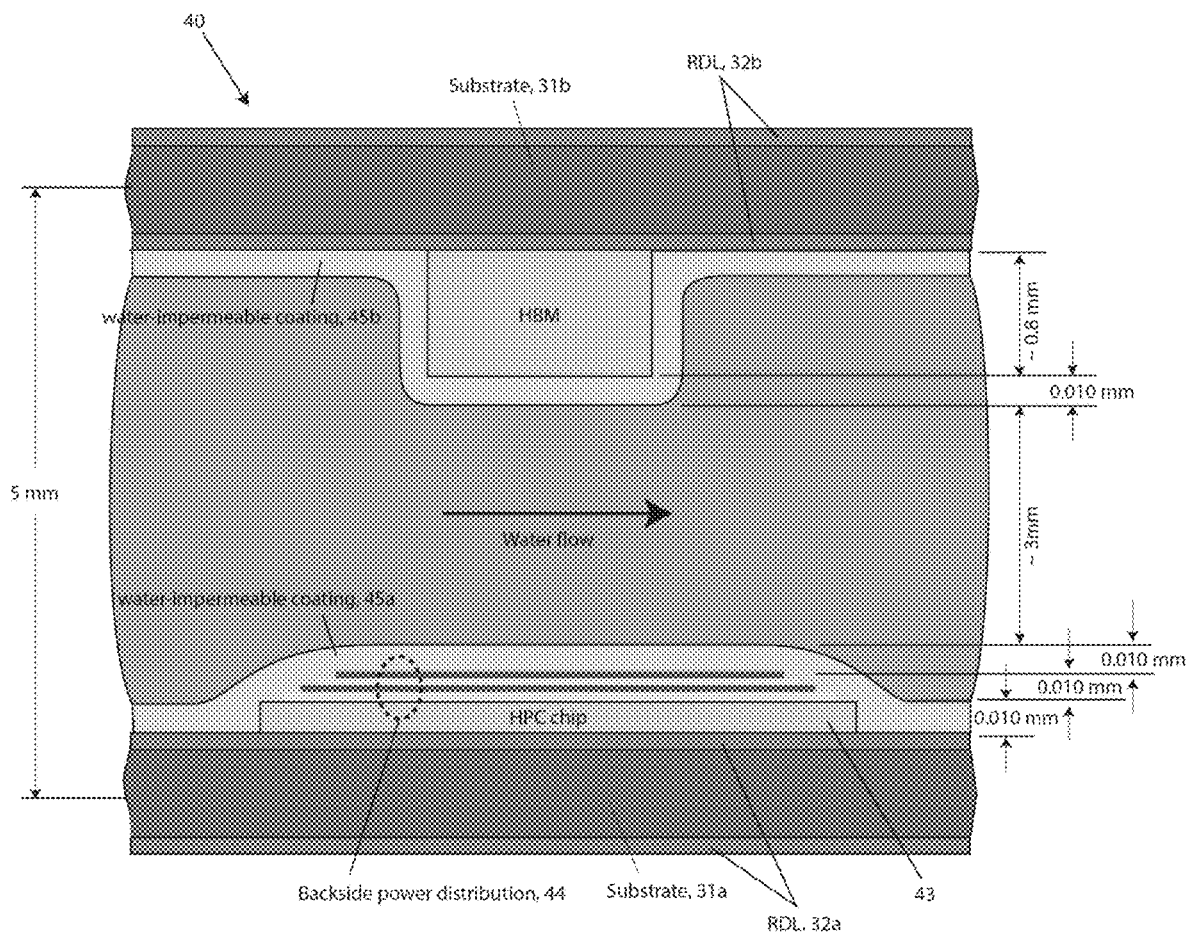
FIG. 4 depicts a thermal configuration for water cooled microelectronic modules, in accordance with an embodiment of the present disclosure.

FIG. 4 illustrates in cross-section a thermal configuration 40 in accordance with an embodiment of the present disclosure. Substrates 31a, 31b, and RDLs 32a and 32b have been previously described in reference to FIG. 3. A high-performance computing (HPC) chip or module 43 is shown mounted on substrate 31a with thin film layers 44 provided for backside power distribution. Water-impermeable coatings 45a and 45b are shown. Approximate dimensions are shown for calculating thermal performance. With reference to FIG. 4, to provide a first approximation, vertical heat flow between the mounted components and the cooling water is considered, but vertical and horizontal heat flow between the components and the substrates is not considered; this is due to much higher thermal resistance for heat flowing through the substrates. Accordingly, the primary heat dissipation exits orthogonally from the back side of each mounted component, and lateral heat-spreading effects are not relied upon.

TABLE 1

| Part | A, mm² | t, mm | P, W | σ, W/m ° C. | θ ° C./W | $\Delta T_2$, ° C. |
|---|---|---|---|---|---|---|
| HPC chip | 814 | 0.050 | 700 | 149 | 0.00041 | 0.289 |
| Backside power distribution, Si3N4 | 814 | 0.005 | 700 | 2.1 | 0.00293 | 2.048 |
| Backside power distribution, copper | 814 | 0.005 | 700 | 390 | 0.00002 | 0.011 |
| Water-impermeable coating, Si3N4 | 814 | 0.005 | 700 | 2.1 | 0.00293 | 2.048 |
| Water-impermeable coating, metal | 814 | 0.005 | 700 | 106 | 0.00006 | 4.395 8.789 |

Table 1 shows heat path contributions for each of the elements in the primary thermal path, for the case of the HPC chip 43. In this embodiment the water-impermeable coating 45a is implemented using conductive and dielectric layers. A is the area of an element in the heat path, t is the corresponding thickness, P is the power flowing through the element, σth is the thermal conductivity, θ is the thermal resistance, and $\Delta T_2$ is the temperature difference across the element. If the water inlet temperature to server 10 is 10° C., then a $\Delta T_1$ of 55° C. results in a water outlet temperature of 65° C. The value of $\Delta T_1$ depends on the number and power of chips along the thermal path from front to back of server 10, and indirectly determines its maximum practical length. Adding to $\Delta T_1$ the temperature rise along the short thermal path from chip junction to water, $\Delta T_2$, as depicted in FIG. 4 and Table 1, adds 8.8° C. for a total junction temperature of around 74° C. This junction temperature is substantially lower than is customary in high powered electronic assemblies and leads to a system having high performance and high reliability and is achieved without any special individual packages or heat sinks. The spacing between substrate centers is shown as 5 mm, consistent with the arrangement of 90 modules depicted in FIG. 2.

Figure 5:
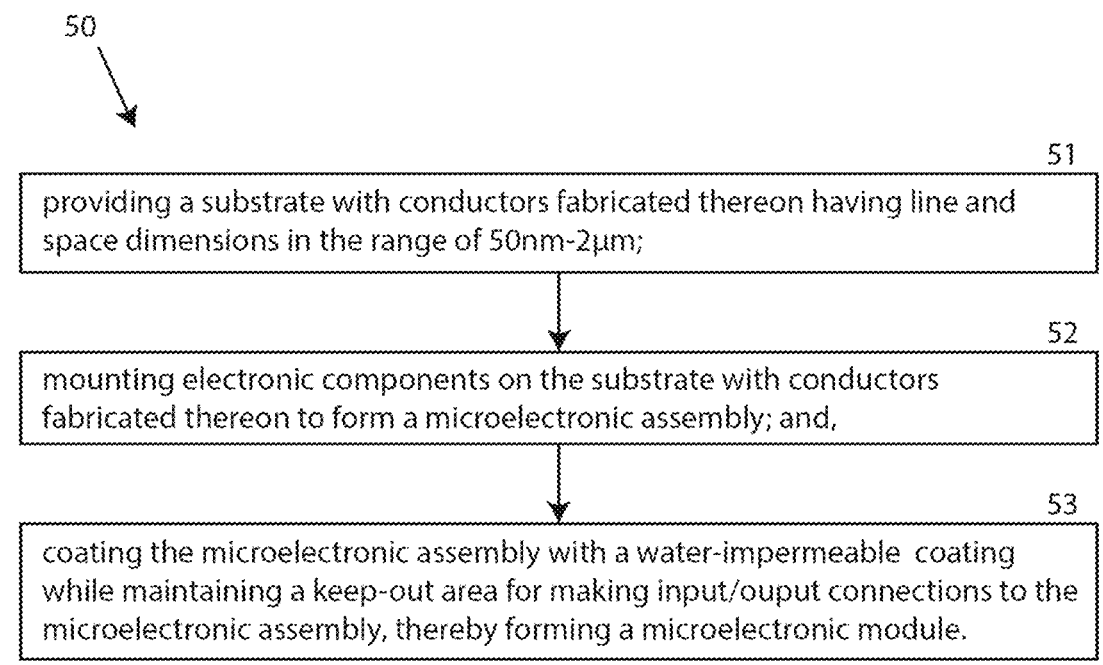
FIG. 5 is a flow chart of a method for manufacturing a microelectronic module, in accordance with an embodiment of the present disclosure.

FIG. 5 is a flow chart comprising the following steps for manufacturing a microelectronic module: providing a substrate with conductors fabricated thereon having line and space dimensions in the range of 50 nm-2 μm, step 51; mounting electronic components on the substrate with conductors fabricated thereon to form a microelectronic assembly, step 52; and finally, coating the microelectronic assembly with a water-impermeable coating while maintaining a keep-out area for making input/output connections to the microelectronic assembly, thereby forming a microelectronic module, step 53.

FIG. 6 is a flow chart for manufacturing and deploying a water-cooled electronic system comprising the steps of: providing a substrate with conductors fabricated thereon having line and space dimensions in the range of 50 nm-2 µm, step 61; mounting electronic components on the substrate with conductors fabricated thereon to form a microelectronic assembly, step 62; coating the microelectronic assembly with a water-impermeable coating while maintaining a keep-out area for making input/output connections to the microelectronic assembly, thereby forming a microelectronic module, step 63; making input/output connections between the microelectronic module and a motherboard, step 64; and finally, partially immersing the microelectronic module in water to form a water-cooled electronic system, step 65.

Figure 7:
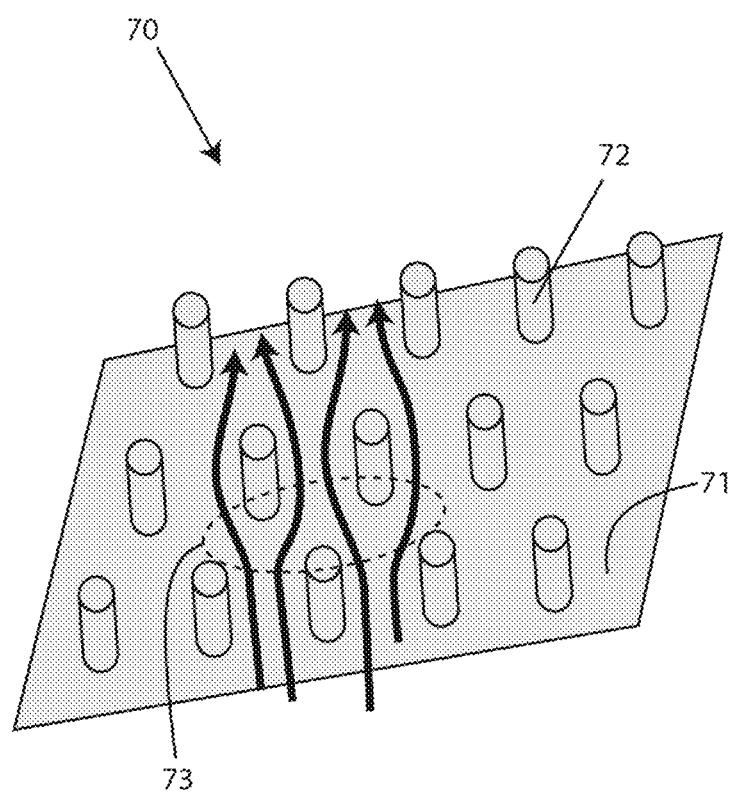
FIG. 7 illustrates patterning of the outer surface of a water-impermeable coating to form a 3D geometry and increase heat transfer from a coated component to the cooling water, in accordance with an embodiment of the present disclosure.

FIG. 7 illustrates the patterning of the outer surface 71 of a water-impermeable coating 70. As shown in FIG. 7, the outer surface has a 3D geometry. The 3D geometry increases heat transfer from the back side of a mounted component to the cooling water, in accordance with an embodiment of the present disclosure. It is well known that as a geometric pattern is reduced in size the ratio of surface area to volume increases; this can provide improvements in the effective heat transfer coefficient at the water interface. Metal pillars 72 or other surface features may be employed to increase the surface area, create local turbulence, and improve the heat transfer coefficient. Water flow is interrupted by the pillars and flows around them 73, as shown in FIG. 7. Surface features may impede the water flow, and this may lead to a requirement for a stronger pump. One method for creating pillars 72 is to provide a mask over the plating surface. The material of the mask inhibits further plating except where it is removed: each hole in the mask results in a plated pillar. The mask may be conformal and comprise a material having good thermal conductance. In an embodiment, a thin layer of copper is deposited on a plated nickel coating. Photoresist is patterned to create closely spaced holes in the resist. In some embodiments, a water solution of sodium persulfate at 50° C. is used to remove the copper exposed by the holes in the resist, without attacking the underlying nickel. The resist is removed, and additional nickel is plated to form pillars at the holes in the copper layer.

An embodiment of the water-cooled server described herein can achieve an average power density of around 780 watts per cubic inch of server tank volume, as will be further described. For comparison, the 4-GPU IBM Power AC922 server model 8335GTW has dimensions 17.4×3.4×33.3 inches. It is water cooled using cooling tubes with a flow rate of around 1 gallon per minute and has a maximum power consumption of 2,300 W. The maximum power density is 2,300/1,970=1.2 watts per cubic inch. The difference in power density between this server and water-cooled server 10 illustrates the utility of the computer architecture described herein. A compaction factor for electronic systems is closely related to power density. Assuming the same chips are used, the total power dissipation will be the same and the volume will be inversely proportional to power density. Accordingly, a compaction factor approaching 650× may be achievable for a computer system having the architecture described herein, compared with the IBM Power server. Thus, variations of embodiments described herein may be advantageously applied to electronic systems where space is at a premium or aggressive cooling is required.

The following calculations are provided in support of the power density claims; they relate to FIGS. 1-3 for water-cooled server 10. An average power density of 0.31 W/mm$^2$ is assumed for semiconductor components attached to substrate 31 of FIG. 2. This average power density is consistent with a tile area of 2000 mm$^2$ having the following mounted components: an EPYC chip measuring 28×36 mm having a power dissipation of 271 watts; a VEGA 10 GPU measuring 22×22 mm having a power dissipation of 300 watts, and an assortment of lower powered chips having an area of 500 mm$^2$ and a combined power dissipation of 50 watts. An interconnection street having a width of 1 mm is provided around each component; this width is dependent on the resolution of the interconnections provided in the fan-in and fan-out of a mounted component. For some components having thousands of pads, the fan-out area must be expanded unless the resolution is better than 2 µm line and space. To overcome this challenge new methods of fabricating panel-sized substrates have been developed. For example, an imprint technology provided by OBDUCAT TECHNOLOGIES AB in Sweden is reported to be capable of 50 nm features across a 500×500 mm substrate.

On each side of substrate 31 an area of 16 in×3.5 in=56 in$^2$ or 36,129 mm$^2$ is provided, with one inch at each end of densely packed front assembly 11 reserved for input/output connectors. With each microelectronic module 21 having two sides, the total usable substrate area for densely packed components is 72,258 mm$^2$. Thus, the total power per substrate 31 (and the total power per microelectronic module 21) is 72,258 mm$^2$×0.31 W/mm$^2$=22.4 kW. Water-cooled server 10 comprises 90 microelectronic modules 21 as shown in FIG. 2. Thus, the total power for water-cooled server 10 is 90×22.4 kW or 2.0 MW. The total volume of server 30 is 4.75×18×30 inches or 2,565 in$^3$. The power density per cubic inch of server volume is 2.0 MW/2,565 in$^3$=780 W/in$^3$. As will be described, adjustments to the water flow rate and the tolerated junction temperature are possible; such adjustments can enable a power density of 1000-2,000 W/in$^3$.

The junction temperature of a high-powered device mounted on a substrate 31 in a microelectronic module 21 will now be calculated. In an embodiment of the present disclosure the high-power chip under consideration is the Hopper GH100 GPU from Nvidia having an area of 814 mm$^2$ and a power dissipation of 700 watts. The cross-sectional area available for water flow along the length of water-cooled server 10 is approximately 2.5 mm×103 mm×91=23,432 mm$^2$ or 36.3 in$^2$ from FIGS. 2 and 4. The water has an average flow velocity of 2 meters or 78.74 inches per second leading to a water flow rate of 2,858 in$^3$/sec or 12.4 gallons per second or 744 gallons per minute (gpm). A different water flow rate may be used. The mass flow rate equation may be used: $\Delta T = q/(m_{dot} * C_p)$, where $\Delta T$ is the temperature rise in degrees Centigrade, q is the dissipated power in watts, $m_{dot}$ is the mass flow rate in grams per sec, and Cp is the specific heat of water (4.186 J/gm° C.). This results in a $\Delta T$ of 10.2° C. which means that the water temperature at the outlet will be 10.2° C. warmer than at the inlet when water-cooled server 10 is dissipating 2.0 MW of heat. The heat path starting at the Hopper GH100 GPU chip, passing through the backside power distribution layers 44 and the water-impermeable coating 45*a* to reach the cooling water, as shown in FIG. 4, will add an additional $\Delta T_2$ of 8.8° C. as shown in Table 1 above. $\Delta T_1 + \Delta T_2 = 10.2° C. + 8.8 = 19°$ C.

Assuming a water inlet temperature of 40° C. a junction temperature of 59° C. is achievable (40+10.2+8.8); this is for one of the highest-powered chips that may be used. This attractive result is a consequence of providing a cooling path with low thermal resistance from chip to cooling water. No customized heat sink is required over and above the standardized thermal architecture that is provided for all chips mounted in microelectronic module 10. The tight thermal coupling of semiconductor components to cooling water also means that hot spots on a die will be less problematic. Since reliability is increased for cooler electronic systems, systems employing similar cooling embodiments will tend to have higher reliability than other systems that may allow the junction temperature to rise to over 100° C. for example.

Manufacturability of microelectronic modules and water-cooled servers described herein is enhanced by the fact that the electronic structures are regularized. Greater automation is achievable because of the regularized structures. For example, die-level components may be assembled onto a large substrate using a precision pick and place machine, as opposed to a mix of manual and automated placements of packaged parts, daughter boards, isolating enclosures, and heat sinks. Similarly, the regularized thermal environment of embodiments described herein provides such strong cooling for all components in a microelectronic module that many conventional rules relating to thermal design may become unnecessary.

As will be understood by those familiar with the art, the invention may be embodied in other specific forms without departing from the spirit or essential characteristics thereof. Likewise, the particular naming and division of the members, features, attributes, and other aspects are not mandatory or significant, and the mechanisms that implement the invention or its features may have different structural construct, names, and divisions. Accordingly, the disclosure of the invention is intended to be illustrative, but not limiting, of the scope of the invention.

While the invention has been described in terms of several embodiments, those of ordinary skill in the art will recognize that the invention is not limited to the embodiments described but can be practiced with modification and alteration within the spirit and scope of the appended claims. For example, another embodiment may comprise a microelectronic module having two back-to-back substrates, each substrate having components mounted on one side only. Other embodiments may have different overall sizes and form factors for the microelectronic module 21 and the water-cooled server 10. Other embodiments may employ liquid coolants other than water, to include dielectric fluids, and mixtures of water and ethylene glycol. The description is thus to be regarded as illustrative instead of limiting. There are numerous other variations to different aspects of the invention described above, which in the interest of conciseness have not been provided in detail. Accordingly, other embodiments are within the scope of the claims.

The invention has been described in relation to particular examples, which are intended in all respects to be illustrative rather than restrictive. Those skilled in the art will appreciate that many different combinations will be suitable for practicing the present invention. For example, the teachings may be applied to other water-cooled electronic systems, especially those with space limitations or aggressive cooling requirements. Other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A microelectronic module comprising:
   a substrate;
   thin film conductors formed on the substrate, wherein selected ones of the thin film conductors have a half-pitch in the range of 50 nm-2 μm;
   a plurality of electronic components mounted on the substrate; and,
   a water impermeable coating that covers the substrate and the plurality of electronic components.

2. The microelectronic module of claim 1, wherein the water impermeable coating comprises a conformable layer.

3. The microelectronic module of claim 2, further comprising covalent bonds between some or all of: constituent layers of the water-impermeable coating, a conformable layer and the substrate, and a conformable layer and the mounted electronic components.

4. The microelectronic module of claim 1, wherein the water-impermeable coating comprises at least one metal layer.

5. The microelectronic module of claim 4, wherein the at least one metal layer comprises a selection of one or more of titanium, nickel, copper, and gold.

6. The microelectronic module of claim 5, wherein one of the at least one metal layers is patterned with a 3D geometry.

7. The microelectronic module of claim 6, wherein the 3D geometry comprises metal pillars.

8. The microelectronic module of claim 2, wherein the conformable layer comprises Parylene C.

9. The microelectronic module of claim 2, wherein the conformable layer comprises at least one metal oxide.

10. The microelectronic module of claim 9, wherein the at least one metal oxide is applied using atomic layer deposition.

11. The microelectronic module of claim 9, wherein the at least one metal oxide comprises a plurality of diyads, wherein each diyad comprises a pair of metal oxides.

12. The microelectronic module of claim 1, wherein the plurality of electronic components are selected from the group consisting of bare die, chiplets, stacked devices, low-profile packaged devices, optical and electro-optical devices, and surface mount devices.

13. The microelectronic module of claim 12, wherein one or more of the stacked devices comprise a chiplet, an interposer, or a bridge device.

14. The microelectronic module of claim 1, operable at a power level in the range of 100-2,000 watts per square centimeter of substrate area.

15. The microelectronic module of claim 1, further comprising a filler material disposed between the mounted electronic components.

16. The microelectronic module of claim 15, wherein the electronic components and the filler material are background and polished to form a polished planar surface.

17. A water-cooled server comprising:
   a plurality of microelectronic modules operable when partially immersed in a tank of water, wherein each microelectronic module comprises:
   a substrate;
   thin film conductors formed on the substrate; wherein selected ones of the thin film conductors have a half-pitch in the range of 50 nm-2 μm;
   a plurality of electronic components mounted on the substrate; and, a water-impermeable coating that covers the substrate and the plurality of electronic components.

18. The water-cooled server of claim 17, further comprising a motherboard, including a socket for connecting each microelectronic module to the motherboard.

19. A method for manufacturing a microelectronic module comprising:
- providing a substrate with conductors fabricated thereon having line and space dimensions in the range of 50 nm-2 µm;
- mounting electronic components on the substrate with conductors fabricated thereon to form a microelectronic assembly; and
- coating the microelectronic assembly with a water-impermeable coating while maintaining a keep-out area for making input/output connections to the microelectronic assembly, thereby creating the microelectronic module.

20. A method for building a water-cooled electronic system comprising:
- providing a substrate with conductors fabricated thereon having line and space dimensions in the range of 50 nm-2 µm;
- mounting electronic components on the substrate with conductors fabricated thereon to form a microelectronic assembly;
- coating the microelectronic assembly with a water-impermeable coating while maintaining a keep-out area for making input/output connections to the microelectronic assembly, thereby creating a microelectronic module;
- making input/output connections between the microelectronic module and a motherboard; and,
- partially immersing the microelectronic module in water to form a water-cooled electronic system.

* * * * *